(12) United States Patent
Fu et al.

(10) Patent No.: US 12,374,645 B2
(45) Date of Patent: Jul. 29, 2025

(54) ELECTRONIC DEVICE INCLUDING DIES AND AN INTERCONNECT COUPLED TO THE DIES AND PROCESSES OF FORMING THE SAME

(71) Applicant: Advanced Micro Devices, Inc., Santa Clara, CA (US)

(72) Inventors: Lei Fu, Austin, TX (US); Raja Swaminathan, Austin, TX (US); Brett P. Wilkerson, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 507 days.

(21) Appl. No.: 17/656,539

(22) Filed: Mar. 25, 2022

(65) Prior Publication Data

US 2023/0307405 A1    Sep. 28, 2023

(51) Int. Cl.
*H01L 23/00*    (2006.01)
*H01L 25/065*    (2023.01)

(52) U.S. Cl.
CPC .............. *H01L 24/24* (2013.01); *H01L 24/16* (2013.01); *H01L 24/19* (2013.01); *H01L 24/20* (2013.01); *H01L 24/25* (2013.01); *H01L 24/73* (2013.01); *H01L 25/0655* (2013.01); *H01L 2224/16137* (2013.01); *H01L 2224/215* (2013.01); *H01L 2224/24101* (2013.01);
(Continued)

(58) Field of Classification Search
CPC ......... H01L 24/19; H01L 24/20; H01L 24/24; H01L 24/25; H01L 25/0655; H01L 2224/16137; H01L 2224/24137; H01L 2224/25175; H01L 2924/1434; H01L 2924/1431; H01L 2924/1427; H01L 2924/14252; H01L 24/16; H01L 2224/24101; H01L 23/5389
USPC ........ 257/774; 438/629, 637, 639, 640, 667, 438/668, 672, 675, 700, 701, 713, 978
See application file for complete search history.

(56) References Cited

U.S. PATENT DOCUMENTS 9,793,230 B1 * 10/2017 Yu ........................ H01L 23/3171
2016/0013153 A1 * 1/2016 Meyer ..................... H01L 24/24
257/737

(Continued)

OTHER PUBLICATIONS

Chiang, Y. P. et al.; "InFO_oS (Integrated Fan-Out on Substrate) Technology for Advanced Chiplet Integration"; IEEE 71st Electronic Components and Technology Conference (ECTC); pp. 130 to 135 (2021).

(Continued)

*Primary Examiner* — Didarul A Mazumder
(74) *Attorney, Agent, or Firm* — Patterson + Sheridan, LLP (57) ABSTRACT

An electronic device can include a first die, a second die, and an interconnect. The first die or the second die has a principal function as a power module or a memory. The first die includes a first bond pad, and the second die includes a second bond pad. The device sides of the first and second dies are along the same sides as the first and second bond pads. In an embodiment, the first die and the second die are in a chip first, die face-up configuration. The first and the second bond pads are electrically connected along a first solderless connection that includes the interconnect. In another embodiment, each material within the electrical connection between the first and the second bond pads has a flow point or melting point temperature of at least 300° C.

16 Claims, 6 Drawing Sheets

(52) U.S. Cl.
CPC .............. *H01L 2224/24137* (2013.01); *H01L 2224/25175* (2013.01); *H01L 2224/73209* (2013.01); *H01L 2924/14252* (2013.01); *H01L 2924/1427* (2013.01); *H01L 2924/1431* (2013.01); *H01L 2924/1433* (2013.01); *H01L 2924/1434* (2013.01); *H01L 2924/37001* (2013.01)

(56) References Cited

U.S. PATENT DOCUMENTS

| | | | | |
|---|---|---|---|---|
| 2016/0071820 | A1* | 3/2016 | Yu | H01L 23/3107 257/737 |
| 2016/0071829 | A1* | 3/2016 | Yu | H01L 23/5389 257/773 |
| 2017/0125346 | A1* | 5/2017 | Liu | H01L 21/76895 |
| 2017/0141040 | A1* | 5/2017 | Yu | H01L 24/00 |
| 2018/0040578 | A1* | 2/2018 | Yu | H01L 23/3185 |
| 2018/0151477 | A1* | 5/2018 | Yu | H01L 24/20 |
| 2019/0139865 | A1* | 5/2019 | Yu | H01L 23/5389 |
| 2019/0139924 | A1* | 5/2019 | Chen | H01L 25/0753 |
| 2019/0148340 | A1* | 5/2019 | Yu | H01L 21/56 257/737 |
| 2019/0157228 | A1* | 5/2019 | Yu | H01L 21/568 |
| 2019/0237423 | A1* | 8/2019 | Chen | H01L 24/24 |
| 2021/0057352 | A1 | 2/2021 | Agarwal et al. | |
| 2022/0102293 | A1* | 3/2022 | Poon | H01L 23/66 |

OTHER PUBLICATIONS

Hsu, Che-Wei et al.; "High Performance Chip-Partitioned Millimeter Wave Passive Devices on Smooth and Fine Pitch InFO RDL"; IEEE 67th Electronic Components and Technology Conference; pp. 254 to 259 (2017).

Mills, Matt; "InFo, the Chip Stacking Technology from TSMC and Intel"; available at https://itigic.com/info-chip-stacking-technology-from-tsmc-and-intel; pp. 1 to 4 (document saved on Mar. 23, 2022).

Tseng, Chien-Fu et al.; "InFO (Wafer Level Integrated Fan-Out) Technology"; IEEE 66th Electronic Components and Technology Conference; pp. 1 to 6 (2016).

Yu, Douglas et al.; "CPI Advancement in Integrated Fan-Out (InFO) Technology"; IEEE; p. 4A-1.1 to 4A-1.4 (2017).

* cited by examiner

ELECTRONIC DEVICE INCLUDING DIES AND AN INTERCONNECT COUPLED TO THE DIES AND PROCESSES OF FORMING THE SAME

FIELD OF THE DISCLOSURE

The present disclosure relates to electronic devices and processes, and more particularly to electronic devices including dies and interconnects between the dies and processes of forming the same.

RELATED ART

A microprocessor die can include a variety circuits and components that are used by the processor and other circuits that control the processor. As the number of circuits and components on the die increase, the size of the die increases, and yield decreases. Thus, this alternative is not fully scalable.

Alternatively, a microprocessor die can be coupled to another die using one of many configurations; however, such configurations have one or more problems, particularly when solder connections are used. In one design, the microprocessor die and the other die may be connected through a packaging substrate. In another design, a two dies can be integrated with a die last fan out for the electrical connections. A redistribution layer can be used to achieve the die last fan out design. A 2.5D design includes an interposer, wherein the two dies can be connected through the interposer. Each of these designs include solder connections, and the solder connections limit the maximum current that can flow through the connections. At a higher current, the solder within the connections can reach a flow point or melting point temperature and cause an electrical open, an undesired leakage path, or an electrical short. As an attempt to address the high current requirement, more connections are needed that results in increasing the die size.

In a further design, the functionality provided by the other die can be provided within a packaging substrate or using a plurality of components connected to the packaging substrate. Such designs can be complex and cause yield losses.

In many of the foregoing designs, the electrical conduction paths are relatively long and induce voltage droop and power loss.

SUMMARY OF DESCRIBED EMBODIMENTS

In an aspect, an electronic device can include a first die including a first bond pad, a first side and a second side opposite the first die, wherein the first bond pad is disposed along the first side of the first die; a second die including a second bond pad, a first side and a second side opposite the first die, wherein the second bond pad is disposed along the first side of the second die; and a first interconnect. The first die and the second die can be in a chip first, die face-up configuration with the first sides of the first die and the second die facing up, the first die or the second die can have a principal function as a power module or a memory, and the first bond pad and the second bond pad can be electrically connected along a first solderless connection that includes the first interconnect.

In an embodiment the first solderless connection includes one or more materials, each of which has a flow point or a melting point temperature greater than 300° C.

In another embodiment, the first solderless connection can withstand a current density of at least 0.15 mA/microns² before the first solderless connection fails using an electromigration test where the solderless connection is held at 110° C. for 50,000 hours.

In still another embodiment, the first die or the second die has the principal function as the power module.

In yet another embodiment, the first die or the second die has the principal function as the memory.

In a further embodiment, the first die includes a processor, and the second die is the power module die or the memory die.

In a further embodiment, the first interconnect is first component of a redistribution structure.

In a particular embodiment, the electronic device further includes a second interconnect. The first die further includes a third bond pad, the second die further includes a fourth bond pad, the third bond pad and the fourth bond pad are electrically connected along a second solderless connection that includes the second interconnect, the second interconnect is a second component of the redistribution structure, and within the redistribution structure, the second interconnect is at a different elevation as compared to the first interconnect.

In another embodiment, the electronic device further includes a polymer material disposed within a gap between the first die and the second die, wherein the first interconnect overlies the polymer material and spans the gap.

In still another embodiment, the electronic device further includes a first conductive stud and a second conductive stud that are components within of the first solderless connection, wherein the first conductive stud contacts the first bond pad, and the second conductive stud contacts the second bond pad.

In yet another embodiment, the electronic device further includes a conductive pillar coupled to the first die or the second die, wherein the conductive pillar is configured to be an external terminal for the electronic device.

In a further embodiment, no conductive pillar of the electronic device contacts the first solderless connection.

In another embodiment, the electronic device further includes a third die including a first side and a second side opposite the first die, wherein the first side includes a third bond pad; and a second interconnect. The first die, the second die, and the third die are in a chip first, die face-up configuration, the first die includes a processor, the second die has a principal function as a memory, the third die has a principal function as a power module, the third bond pad and a fourth bond pad are electrically connected along a second solderless connection that includes the second interconnect, and the first die or the second die includes the fourth bond pad that is different from the first bond pad and the second bond pad.

In another aspect, an electronic device can include a first die including a first bond pad, a first side and a second side opposite the first die, wherein the first bond pad is disposed along the first side of the first die; a second die including a second bond pad, a first side and a second side opposite the first die, wherein the second bond pad is disposed along the first side of the second die; and a first interconnect. The first die can be oriented such that the first side of the first die is above the second side of the first die, the second die can be oriented such that the first side of the second die is above the second side of the second die, the first die or the second die can have a principal function as a power module or a memory, and the first bond pad and the second bond pad can be electrically connected along a first connection that includes the first interconnect, wherein each material within the first connection between the first bond pad and the second bond pad has a flow point or melting point of at least 300° C.

In an embodiment, the electronic device further includes a first conductive stud and a second conductive stud. The first conductive stud contacts the first bond pad of the first die, the second conductive stud contacts the second bond pad of the second die, and the first conductive stud, the second conductive stud, and the interconnect lie along an electrical conduction path between the first bond pad and the second bond pad.

In another embodiment, the electronic device further includes a conductive pillar, wherein the conductive pillar is coupled to a third bond pad of the first die or the second die, and the conductive pillar is configured to be an external terminal for the electronic device.

In a further aspect, a process of forming an electronic device can include reconstituting a first die and a second die in a chip first, die-face up configuration. The first die can include a first bond pad, a first side and a second side opposite the first die, wherein the first bond pad is disposed along the first side of the first die, the second die can include a second bond pad, a first side and a second side opposite the first die, wherein the second bond pad is disposed along the first side of the second die, and the first sides of the first die and the second die face up. The process also includes forming an interconnect overlying the first die and the second die, wherein after forming the interconnect, the first bond pad and the second bond pad are electrically connected along a solderless connection that includes the interconnect.

In an embodiment, the process further includes forming a first conductive stud and a second conductive stud. The first conductive stud contacts the first bond pad of the first die, and the second conductive stud contacts the second bond pad of the second die. The first conductive stud, the second conductive stud, and the interconnect lie along an electrical conduction path between the first bond pad and the second bond pad.

In another embodiment, the process further includes forming a conductive pillar, wherein the conductive pillar is coupled to a third bond pad of the first die or the second die, and the conductive pillar is configured to be an external terminal for the electronic device.

In a further embodiment, forming the interconnect is part of forming a redistribution structure.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

The term "electrically coupled" is intended to mean a connection, linking, or association of two or more electronic components, circuits, systems, or any combination of: (1) at least one electronic component, (2) at least one circuit, or (3) at least one system in such a way that a signal (e.g., current, voltage, or optical signal) may be partially or completely transferred from one to another. A non-limiting example of "electrically coupled" can include an electrical connection between two electronic components. In a circuit diagram, a node corresponds to an electrical connection between the electronic components. Thus, an electrical connection is a specific type of electrical coupling; however, not all electrical couplings are electrical connections. Other types of electrical coupling include capacitive coupling, resistive coupling, and inductive coupling.

Group numbers correspond to columns within the Periodic Table of Elements based on the International Union of Pure and Applied Chemistry (IUPAC) Periodic Table of Elements, version dated Dec. 1, 2018.

The term "normal operation" and "normal operating state" refer to conditions under which an electronic component or device is designed to operate. The conditions may be obtained from a data sheet or other information regarding voltages, currents, capacitance, resistance, or other electrical conditions. Thus, normal operation does not include operating an electrical component or device well beyond its design limits.

Unless explicitly stated to the contrary, the terms "horizontal," "lateral," and their variants are in a direction parallel to a primary surface of a substrate or structure, and the terms "vertical" and its variants are in a directions perpendicular to a primary surface of a substrate or a semiconductor layer.

The terms "on," "overlying," and "over" may be used to indicate that two or more elements are in direct physical contact with each other. However, "over" may also mean that two or more elements are not in direct contact with each other. For example, "over" may mean that one element is above another element, but the elements do not contact each other and may have another element or elements in between the two elements.

The terms "comprises," "comprising," "includes," "including," "has," "having," or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read such that the plurals include one or at least one and the singular also includes the plural, unless it is clear that it is meant otherwise. For example, when a single item is described herein, more than one item may be used in place of a single item. Similarly, where more than one item is described herein, a single item may be substituted for that more than one item.

The use of the word "about," "approximately," or "substantially" is intended to mean that a value of a parameter is close to a stated value or position. However, minor differences may prevent the values or positions from being exactly as stated. Thus, differences of up to ten percent (10%) for the value are reasonable differences from the ideal goal of exactly as described. When values of a parameter are significantly different, such values are more than 10% different. When values of a parameter are different (e.g., less than, greater than, a numerical difference between values, or the like) and within manufacturing tolerances for commercial production are insignificantly different.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

Figure 1:
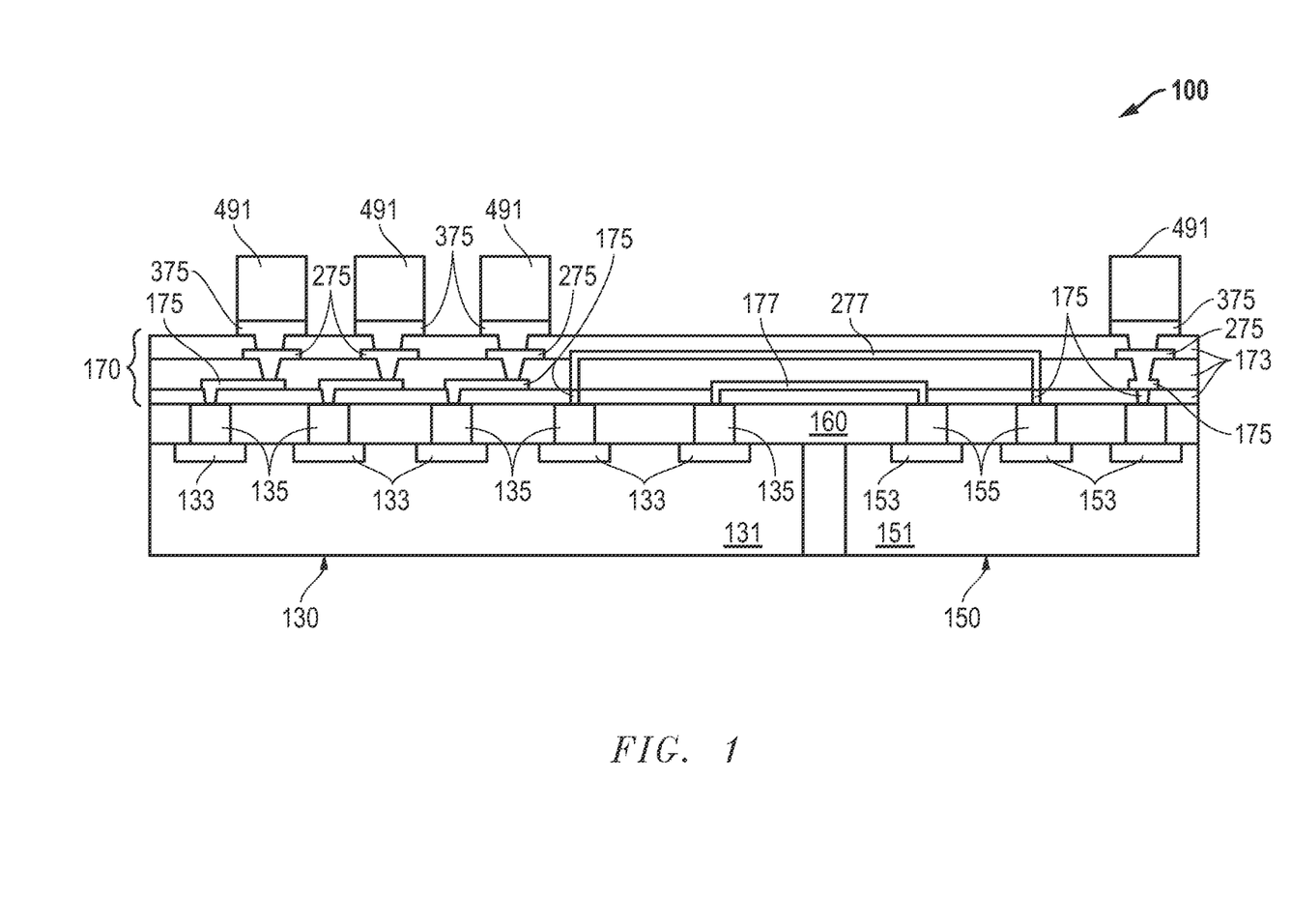
FIG. 1 includes an illustration of a cross-sectional view of a conventional electronic device that includes two dies.

Previously, others have formed electronic devices in packages where high current flow between dies is not a significant issue. FIG. 1 includes an illustration of a conventional electronic device 100 that includes two logic dies 130 and 150. The logic die 130 includes a processor that is configured to process data, and the logic die 150 includes a processor or is an application-specific integrated circuit (ASIC) die or a field-programmable gate array (FPGA) die. Neither logic die 130 nor 150 is a memory die or a die including a power module. Each of the logic die 130 and 150 includes a silicon substrate 131 and 151 and has bond pads 133 and 153 along a surface of the logic dies 130 and 150. Although not illustrated, within each of the logic dies 130 and 150, many circuits and circuit elements are located near the surface of the die that is closer to the bond pads 133 or 153.

Copper studs 135 and 155 overlie the bond pads 133, and 153, respectively, and a mold compound 160 lies between and over the logic dies 130 and 150 and laterally surrounds the copper studs 135 and 155. A redistribution layer 170 includes patterned polyimide layers 173 and copper interconnects 175, 177, 275, 277, and 375. A seed layer (not illustrated) underlies each of the copper interconnects 175, 177, 275, 277, and 375. As illustrated in FIG. 1, the copper interconnects 177 and 277 contact particular bond pads 133 and 153 on the logic dies 130 and 150. The copper interconnect 177 lies at one elevation, and the copper interconnect 277 lies at a different elevation. Copper pillars 491 contact exposed portions of interconnects 375. Within the electronic device 100, the electrical connections between the logic dies 130 and 150 are free of solder.

The inventors have discovered that a power module die or a memory die can be used in an electronic device, where solderless connections are used between any combination of (1) a power module die and a die that includes a processor, (2) a power module die and a memory die, (3) a memory die and a die that includes a processor, or (4) a power module die, a memory die, and another die that may or may not include a processor. In any of the foregoing combinations, the solderless connections can be used in electrical connections between the dies. A solderless connection allows for a conduction path that does not include a Controlled Collapse Chip Connection (C4) bump, a microbump, or other conductive bump along the conduction path. The solderless connection allows the dies to be placed closer together because bumps are not required along a conduction path between the dies.

The solderless connections allow for substantially higher current density before failing as compared to an electrical connection that includes solder. A solderless connection is particularly well suited for a power module die in view of high current received by or sent from the power module die. Further, the electronic device can have a chip first, die face-up configuration. A more complex 2.5D packaging architecture or 3D packaging architecture can be avoided.

Figure 2:
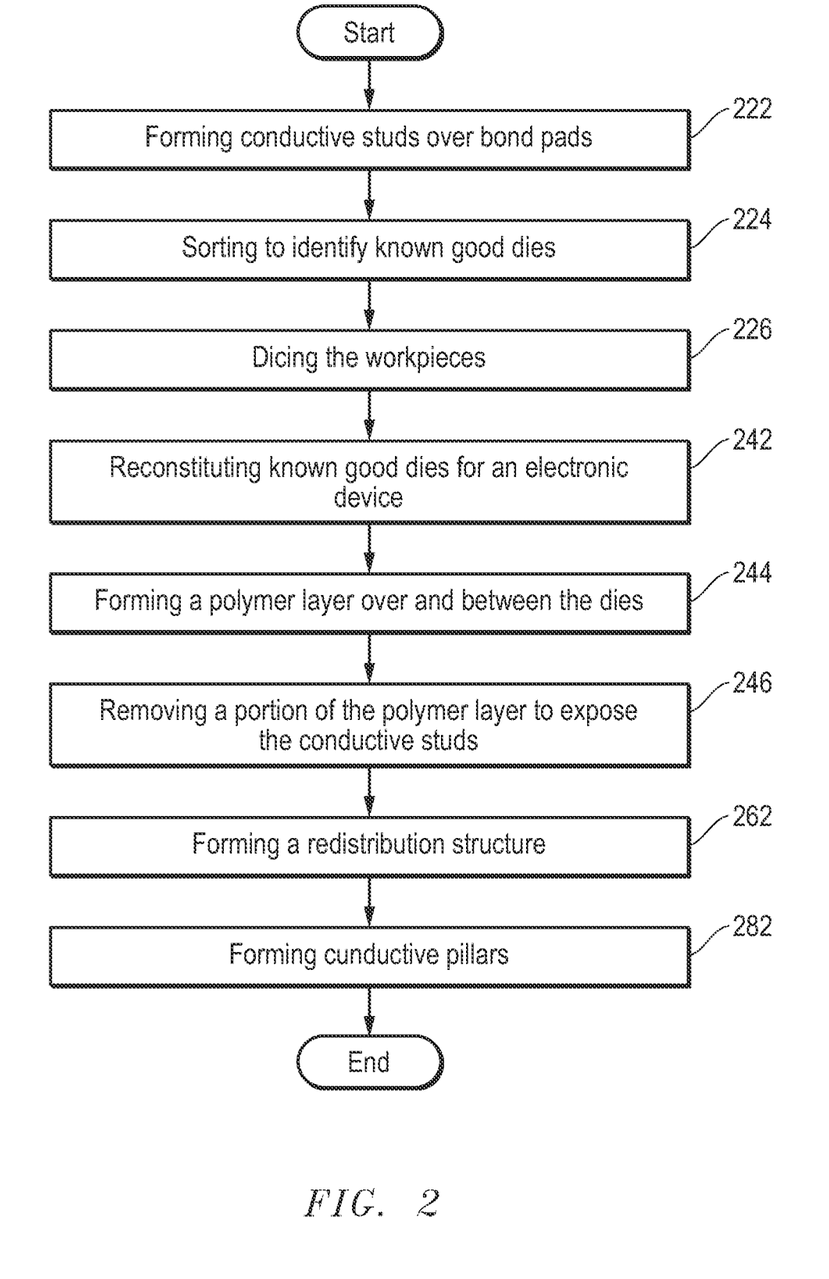
FIG. 2 includes a flow diagram of a process of forming an electronic device in accordance with an embodiment.
Figure 3:
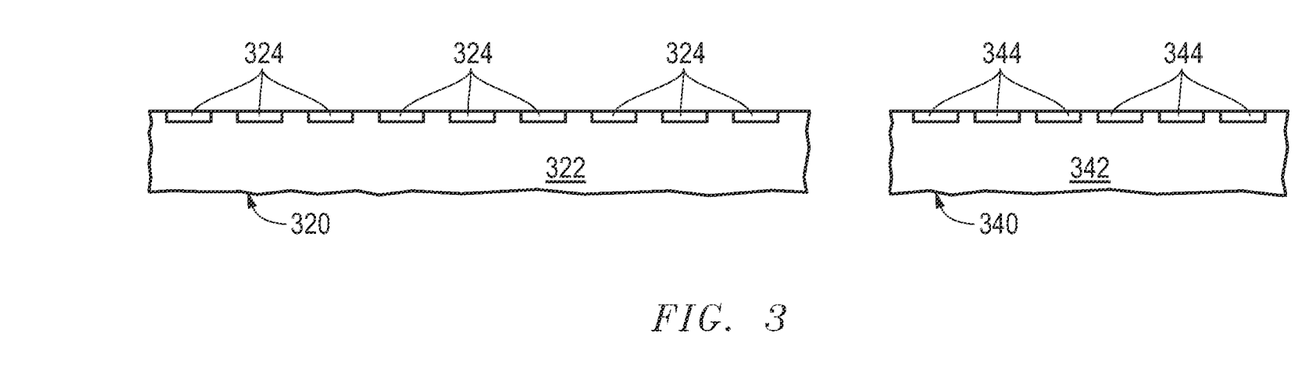
FIG. 3 includes an illustration of cross-sectional views of portions of workpieces that include bond pads.

FIG. 2 includes a flow diagram of a process of forming an electronic device using the workpieces as illustrated in FIG. 3. FIG. 3 includes cross-sectional views of workpieces 320 and 340. The workpiece 320 includes a substrate 322, and the workpiece 340 includes a substrate 342. Each of the substrates 322 and 342 includes a semiconductor base material, circuits and circuit elements, and one or more level of interconnects. Such features are not illustrated to simplify understanding of the concepts described herein. The workpieces 320 and 340 may be formed using the same processing flow or different process flows. During at least some operations, the workpieces 320 and 340 are processed separately.

The semiconductor base material can include a semiconductor base material that can be monocrystalline and include one or more Group 14 elements, such as Si, SiC, Ge, a III-V semiconductor compound, or the like. The semiconductor base material can be in the form of a wafer, where the wafer includes a plurality of dies before dicing the wafer. The substrates 322 and 342 can have the same semiconductor base material or different semiconductor base materials. Circuits and circuit elements for the dies can be within the semiconductor base material, one or more layers overlying the semiconductor base material, or partly within the semiconductor base material and partly within one or more layers overlying the semiconductor base material. Bond pads 324 and 344 lie along exposed surfaces of the workpieces 320 and 340. The bond pads 324 and 344 may or may not be part of an interconnect level. The bond pads 324 and 344 include an electrically connective material. In an embodiment, Al or Cu can make up a majority of the composition of the bond pads 324 and 344. A passivation layer laterally surrounds the bond pads 324 and 344.

Figure 4:
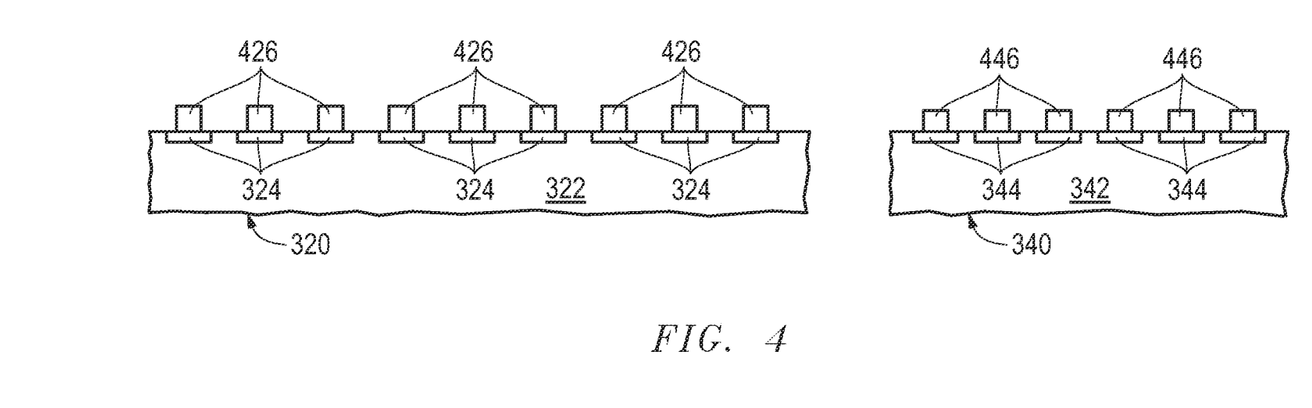
FIG. 4 includes an illustration of cross-sectional views of the workpieces of FIG. 3 after forming conductive studs over the bond pads.

The process includes forming conductive studs over the bond pads at block 222 in FIG. 2. FIG. 4 includes cross-sectional views of the workpieces 320 and 340 after forming conductive studs 426 and 446 over the bond pads 324 and 344. The conductive studs can include conductive material that is capable of being plated or deposited, such as Cu, Ni, Au, or the like.

In an embodiment, for each of the workpieces 320 and 340, a sacrificial layer can be formed as a template to define the shape of the conductive studs 426 and 446. The sacrificial layer includes a material that can be selectively removed from the passivation layer, the bond pads 324 and 344, and the conductive studs 426 and 446. The sacrificial layer includes an insulating material having a composition different from the passivation layer. For example, the sacrificial layer can include a silicon oxide, and the passivation layer can have a silicon nitride or a silicon oxynitride along its exposed surface. The sacrificial layer is patterned to define openings corresponding to the shape of the conductive studs 426 and 446.

For each of the workpieces 320 and 340, a conductive material is formed within the openings in the sacrificial layer and over the bond pads 324 and 344. The conductive material is plated to form the conductive studs 426 and 446. In this embodiment, the conductive material is only plated onto the bond pads 324 and 344 that are exposed along bottoms of the openings and not over the exposed surface of the sacrificial layer.

In another embodiment, the conductive material is deposited as a layer within the openings and over the sacrificial layer. Portions of the conductive material overlying the sacrificial layer are removed to form the conductive studs 426 and 446. After the conductive studs 426 and 446 are formed, the sacrificial layer is removed.

In a further embodiment, the conductive studs 426 or 446 can be formed on the bond pads 324 and 344 without the sacrificial layer. For example, the conductive material for the conductive studs 426 or 446 can be plated onto the bond pads 324 or 344 without using the sacrificial layer. In this embodiment, the resultant conductive studs 426 or 446 can have more rounded, rather than flat, upper surfaces. When forming the conductive studs 426 and 446 without a sacrificial layer, the bond pads 324 or 344 may be spaced apart sufficiently so that adjacent conductive studs 426 or 446 do not electrically short to each other.

The process further includes sorting to identify known good die at block 224 in FIG. 2. Each of the workpieces 320 and 340 are tested using a sorting machine. The sorting machine is programmed, such that each type of die has its own testing algorithm. Each die that passes its test is identified as a known good die.

The process includes dicing the workpieces at block 226. If needed or desired, the workpieces 320 and 340 can be backgrounded to remove portions of the substrates opposite the conductive studs 426 and 446. Each of the workpieces 320 and 340 includes a plurality of dies. Dicing can be performed along scribe lanes to separate the workpieces 320 and 340 into dies.

Figure 5:
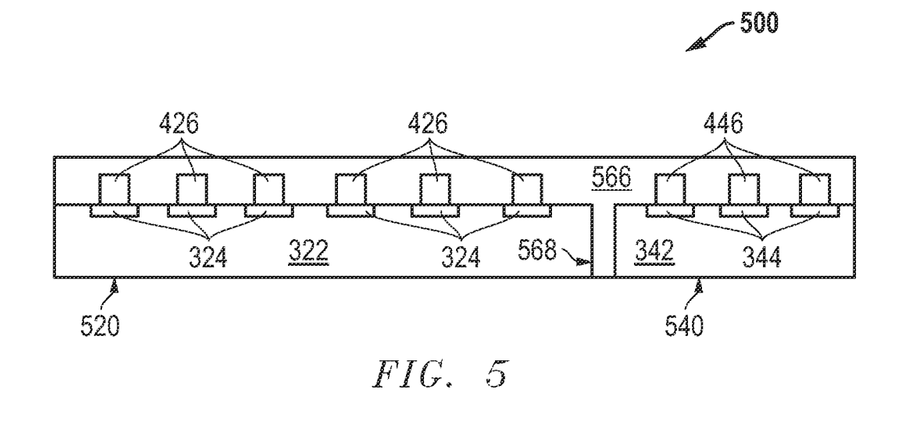
FIG. 5 includes an illustration of a cross-sectional view of a partially completed electronic device after reconstituting dies from the workpieces and forming a polymer layer.

The process also includes reconstituting known good dies for an electronic device at block 242. Referring briefly to FIG. 5, dies 520 and 540 are obtained from the workpieces 320 and 340. During reconstitution, a tool can be used to pick the dies 520 and 540 from the workpieces 320 and 340 and place the dies 520 and 540 onto a wafer or a panel. The dies 520 and 540 are oriented such that the device sides are closer to the conductive studs 426 and 446 than to the opposite sides of the dies 520 and 540 which are closer to a wafer or panel.

The dies 520 and 540 are different types of dies. Types of die can include a processor for processing data, such as a microprocessor, a graphics processing unit (GPU), a digital signal processor (DSP), a memory device, an application integrated specific circuit (ASIC), or the like. As used herein, the types of devices are identified by their principal function. For example, a microprocessor die can include a memory array; however, a microprocessor die's principal function is to process data and not to store data. Thus, a microprocessor die is not a memory die. A memory die has a principal function to store data and can be an SRAM die, a DRAM die, a flash memory die, etc. A power module die can include an energy converter or a power management controller.

An energy converter can include an alternating current-to-direct current (AC-to-DC) converter, such as a bridge rectifier or a direct current-to-direct current (DC-to-DC) converter, such as a voltage regulator, for example a buck converter or a DC-to-DC step-down switching regulator.

In a particular embodiment, the die 520 is a microprocessor die, and the die 540 is a power management die or a memory die. In another embodiment, another combination can be used for the dies 520 and 540. In the same or different embodiment, the electronic device can include more than two dies, wherein at least one of the dies is a power module die or a memory die.

The process further includes forming a polymer layer over and between the dies at block 244 of FIG. 2. FIG. 5 includes a cross-sectional view of an electronic device 500 after forming a polymer layer 566 over the die 520, including the conductive studs 426, and the die 540, including the conductive studs 446. A portion of the polymer layer 566 is disposed within the gap 568 between the dies 520 and 540. If needed or desired, a portion of the polymer layer 566 can lie along the outside sides of the dies 520 and 540, although such an embodiment is not illustrated in FIG. 5. The polymer layer 566 can be a molding compound that includes an epoxy resin (a polyepoxide), a polyimide, or another polymer material. Inorganic insulating filler particles may be used with the epoxy resin, and the filler particles can include $SiO_2$, $Si_3N_4$, BN, $Al_2O_3$, or the like.

Figure 6:
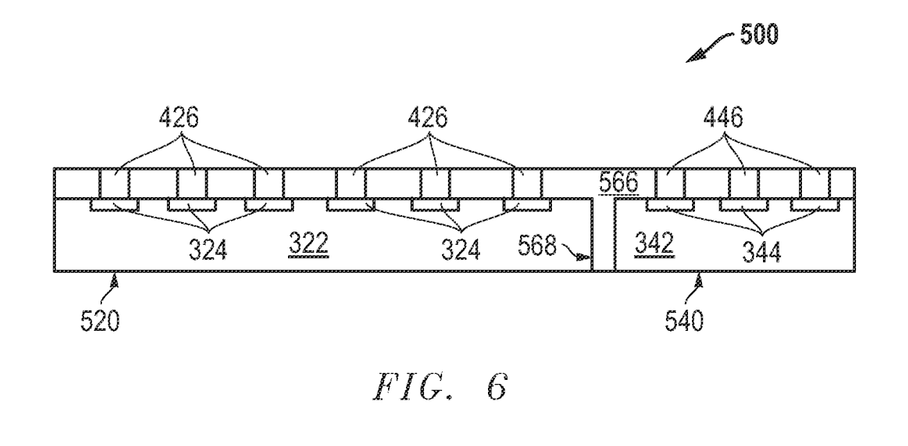
FIG. 6 includes an illustration of a cross-sectional view of the electronic device of FIG. 5 after removing a portion of the polymer layer to expose the conductive studs.

The process includes removing a portion of the polymer layer to expose the conductive studs at block 246 in FIG. 2. FIG. 6 includes a cross-sectional view of the electronic device 500 after a portion of the polymer layer 566 has been removed to expose the conductive studs 426 and 446. The removal can be performed by grinding away the polymer layer 566 until the conductive studs 426 and 446 are exposed. In another embodiment, the removal can be performed by etching.

Figure 7:
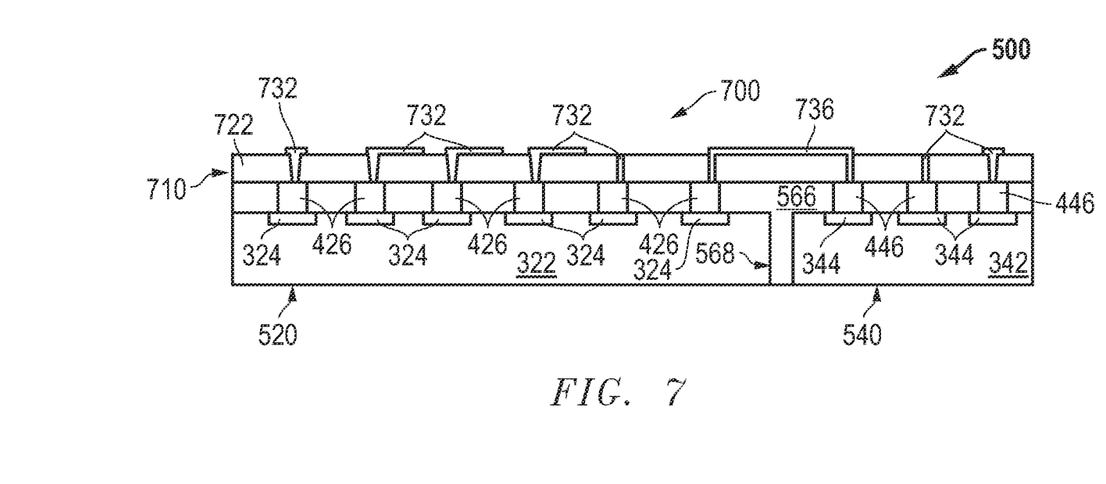
FIG. 7 includes an illustration of a cross-sectional view of the electronic device of FIG. 6 after forming a level of interconnects.
Figure 8:
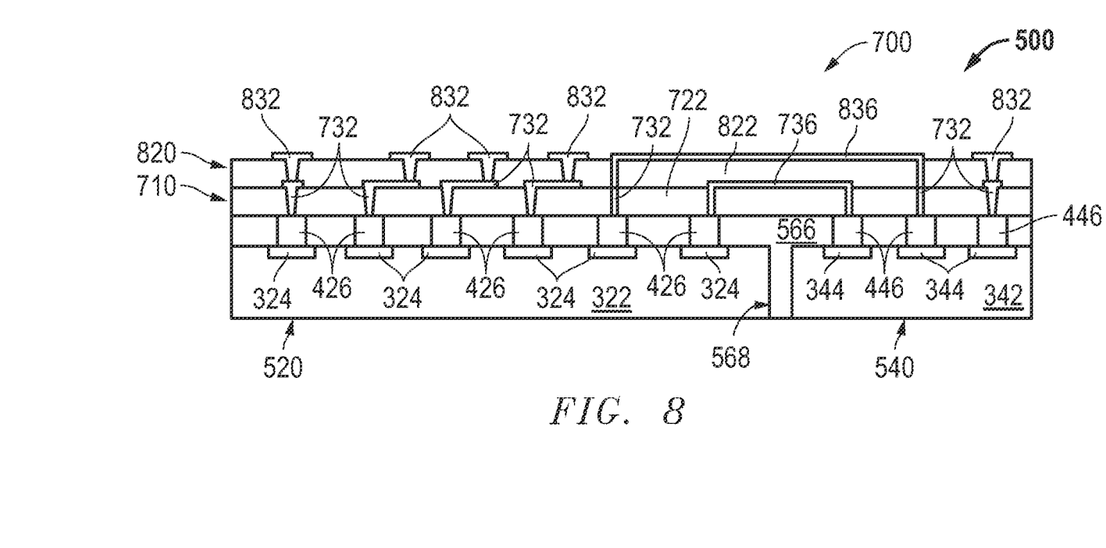
FIG. 8 includes an illustration of a cross-sectional view of the electronic device of FIG. 7 after forming another level of interconnects.
Figure 9:
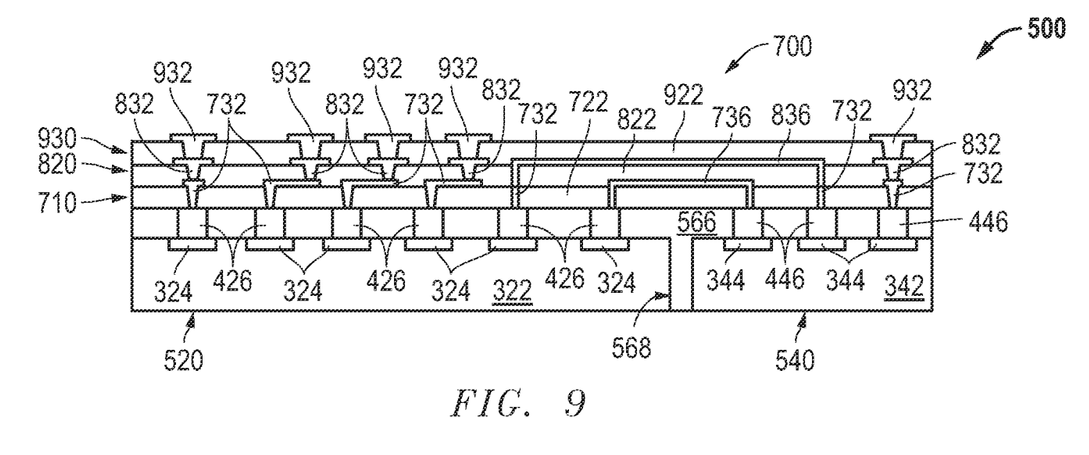
FIG. 9 includes an illustration of a cross-sectional view of the electronic device of FIG. 8 after forming a further level of interconnects.

The process further includes forming a redistribution structure at block 262 in FIG. 2. The redistribution structure allows for routing of power and signals along interconnects that are coupled between the dies 520 and 540 and between either or both of the dies 520 and 540 and subsequently-formed external terminals for the electronic device 500. FIGS. 7 to 9 include cross-sectional views in forming the redistribution structure.

Referring to FIG. 7, a first interconnect level 710 of a redistribution structure 700 is formed. A polyimide layer 722 is formed over polymer layer 566 and the conductive studs 426 and 446 and patterned to define openings to expose the conductive studs 426 and 446. A seed layer (not separately illustrated) can be formed over the polymer layer 566 and within the openings in the polymer layer 566. The seed layer can include Ta, TaN, TaSi$_2$, Ti, TiW, TiSi$_2$, TiN, W, TiW or the like. The seed layer fills part, but not all, of the openings in the polymer layer 566. The seed layer has a thickness sufficient to make the seed layer continuous but not so thick as to adversely affect contact resistance. In an embodiment, the seed layer has a thickness in a range from 11 nm to 500 nm. The seed layer is patterned to form a patterned seed layer that corresponds to the desire routing within this first interconnect level 710 of the redistribution structure 700.

A bulk conductive layer is formed over the seed layer. The bulk conductive layer provides for low resistance interconnects to be formed, as the bulk conductive layer has a resistivity substantially less than the resistivity of the seed layer. The bulk conductive layer can include Cu, Ni, Au, or the like. The bulk conductive layer has a thickness in a range from 50 nm to 10 microns. In an embodiment, the bulk conductive layer is formed by selectively plating the metal onto the seed layer. The bulk conductive layer is not plated onto the polymer layer 566, although some of the bulk conductive layer may contact the polymer layer 566 along sides of the seed layer that are exposed before plating begins. When selective plating is used, the bulk conductive layer does not need to be patterned.

At this point in the process first level interconnects 732 and 736 are formed and include portions of the seed layer and conductive metal layer. The interconnects 732 include vertical portions and may or may not have a portion for lateral routing of power or signals. The interconnect 736 couples dies 520 and 540 to each other.

In the embodiment illustrated in FIG. 7, the interconnect 736 contacts a pair of conductive studs 426 and 446, overlies the polymer layer 566 and spans the gap 568 between the dies 520 and 540. No solder is along an electrical conduction path between the bond pads 324 and 344 of the dies 520 and 540, and thus, the connection between the bond pads 324 and 344 is a solderless connection. Solder typically includes an alloy including (1) Sn or In and (2) one or more of Ag, Cu, or Au. Thus, in an embodiment, a solderless connection does not include any of Sn, In, and an alloy that includes Sn or In. Solder has a flow point or melting point temperature of less than 300° C.

The maximum current density for an interconnect is determined by an electromigration test where the interconnect is held at a temperature of 110° C. for a time of 50,000 hours while current flows through the interconnect. The current at which the interconnect fails during the electromigration test is the maximum current ($I_{max}$) for the interconnect. $I_{max}$ is divided by the cross-sectional area of the interconnect, where the cross-sectional area is in a direction perpendicular to the current flow during the electromigration test. If solder was used in the connection, the current density for an interconnect may be limited to 0.13 mA/microns$^2$. In an embodiment, the interconnect 736 can withstand a current density of at least 0.15 mA/microns$^2$, at least 0.9 mA/microns$^2$, or at least 3.0 mA/microns$^2$ before failing when the electromigration test is used. The same electromigration test can also be used to test electrical connections. In the same or different embodiment, the current density is at most 10 mA/microns$^2$.

Another interconnect level 820 within the redistribution structure 700 can be formed as illustrated in FIG. 8. A polyimide layer 822 can be formed as patterned as previously described with respect to the polyimide layer 722. The interconnects 732 are exposed at openings within the polyimide layer 822 before forming the interconnects 832 and 836. The interconnects 832 and 836 can have any of the layers, materials, thicknesses and be formed using any of the techniques previously described with respect to the interconnects 732 and 736. The interconnects 832 and 836 can have the same or a different number of the layers, materials, thicknesses and be formed using any of the techniques as compared to the interconnects 732 and 736.

The interconnects 832 contact interconnects 732, which contact underlying the conductive studs 426 and 446, which contact the bond pads 324 and 344. The interconnect 836 contacts a pair of the interconnects 732, which contact underlying the conductive studs 426 and 446, which contact the bond pads 324 and 344. The interconnect 836 overlies the polymer layer 566 and spans the gap 568 between the dies 520 and 540. The interconnect 836 is at a different elevation as compared to the interconnect 736. In the embodiment as illustrated, the interconnect 736 is at an elevation between the elevation of the bond pads 324 and 344 and an elevation of the interconnect 836.

The interconnect 836 is similar to the interconnect 736. No solder is along an electrical conduction path between the bond pads 324 and 344 of the dies 520 and 540 via the interconnect 836. Thus, the electrical connection between the bond pads 324 and 344, which includes the interconnect 836, is a solderless connection. The electrical connection that includes the interconnect 836 can have any of the current densities as previously described with respect to the interconnect 736.

A further interconnect level 930 is formed as illustrated in FIG. 9. A polyimide layer 922 can be formed as patterned as previously described with respect to the polyimide layer 722. The interconnects 832 are exposed at openings within the polyimide layer 922 before forming the interconnects 932. The interconnects 932 contact interconnects 832. The interconnects 932 can have any of the layers, materials, thicknesses and be formed using any of the techniques previously described with respect to the interconnects 732 and 736. The interconnects 932 can have the same or a different number of the layers, materials, thicknesses and be formed using any of the techniques as compared to the interconnects 732 and 736 or as compared to the interconnects 832 and 836. Although not illustrated, an interconnect similar to the interconnects 736 and 836 can be formed at the interlevel added in FIG. 9. At this point in the process, formation of the redistribution structure 700 is completed.

Figure 10:
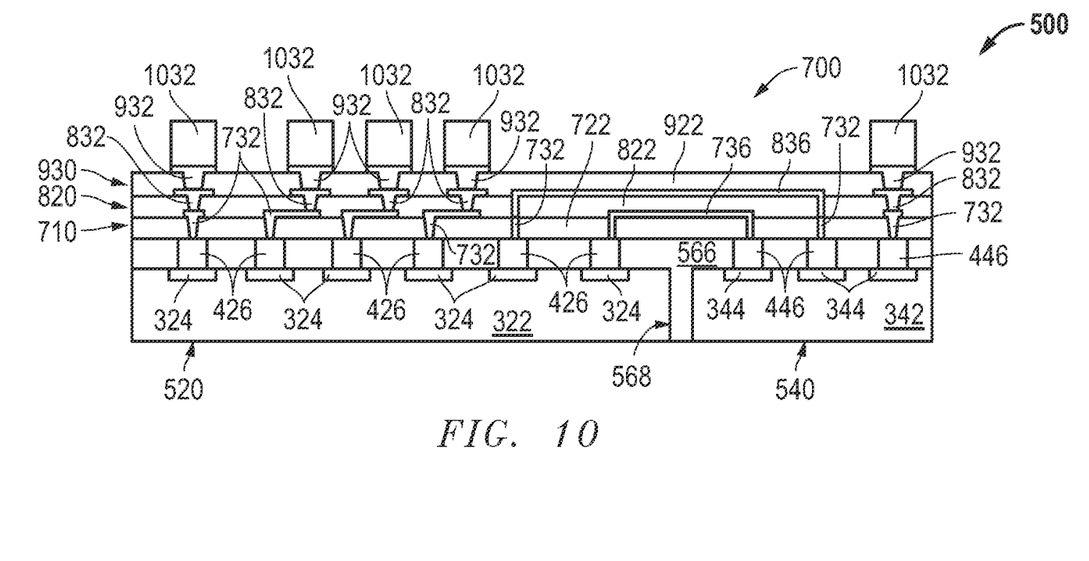
FIG. 10 includes an illustration of a cross-sectional view of the electronic device of FIG. 9 after forming conductive pillars over at least some of the interconnects.

The process includes forming conductive pillars at block 282 in FIG. 2. FIG. 10 illustrates a cross-sectional view of the electronic device 500 after forming conductive pillars 1032. The conductive pillars 1032 can include any of the materials as previously described with respect to the interconnects 732 and 736. A seed layer may or may not be used. In an embodiment, a patterned sacrificial layer (not illustrated in FIG. 10) can be formed over the redistribution structure 700 and have openings corresponding to locations where the conductive pillars 1032 are to be formed. The conductive material can be plated and form the conductive pillars 1032 having shapes that correspond to the openings in the patterned sacrificial layer. After the conductive pillars 1032 are formed, the patterned sacrificial layer is removed. In another embodiment, the conductive material is plated onto the interconnects 932 without a patterned sacrificial layer present. In this embodiment, the shape of the conductive pillars 1032 may be different as compared to what is illustrated in FIG. 10. Similar to an embodiment described with respect to the conductive studs 426 and 446, the conductive material for the conductive pillars 1032 is not plated onto the polyimide layer 922; however, the conductive pillars 1032 may contact the polyimide layer 922 where sides of the interconnects 932 are exposed at the beginning of plating when forming the conductive pillars 1032.

Further processing may be performed if needed or desired for a particular embodiment. For example, a material for C4 bumps can be formed on the conductive pillars 1032. Although the C4 bumps can include solder material previously described, the solder material is not in the electrical connections between the dies 520 and 540. Thus, a solder material can be used with the electronic device 500, provided the current density is sufficiently low that the solder material does not reach its flow point or melting point temperature during the normal operation of the electronic device 500.

The embodiment as illustrated in FIG. 10 is exemplary and not intended to limit the scope of the invention as defined in the appended claims. As compared to the redistribution structure 700, other redistribution structures can be used in other embodiments. Another redistribution structure can have more or fewer interconnect levels. Interconnects between dies 520 and 540 may be at more or fewer interconnect levels. Either or both interconnects 736 and 836 may contact more than one bond pad on either or both dies 520 and 540. Further, a conductive pillar can contact the interconnect 736 or 836 or be part of an electrical connection that includes the interconnect 736 or 836. After reading this specification, skilled artisans will be able to design an electronic device with a redistribution structure for a particular application.

Embodiments described herein provide an electronic device that is relatively easier to implement and provides robust electrical connections between dies. The electronic device 500 has a chip first, die-face up configuration. The dies 520 and 540 can be attached to a wafer or a panel. Both dies 520 and 540 are face up, meaning the circuits within the dies 520 and 540 are closer to the bond pads 324 and 344, as compared to the other side of the dies 520 and 540 that can be coupled to the wafer or the panel. The chip first, die-face up configuration allows a 2D packaging architecture. A 2.5D packaging architecture, which can include an interposer to connect the dies, or a 3D packaging architecture, where the dies are positioned one above the other, are significantly more difficult to implement.

The redistribution structure 700 provides fan-out connections that can be operated at relatively higher current densities before an electrical connection fails, as compared with solder-based electrical connections between dies. In a flip-chip configuration, the devices sides of the dies face each other, and the electrical connections are made using micro-bumps, which are small solder connections. The electronic device 500 does not use the micro-bumps to connect the dies 520 and 540. The solderless connections in the electronic device 500 are well suited when one of the dies is a power module die.

The concepts described herein can be used with a memory die, too. When a logic die, such as a microprocessor, includes a memory array, such an SRAM cache memory array, increasing the size of the memory array is not acceptable because the size of the logic die increases. Thus, the memory array on the logic die cannot be scaled. The die yield decreases with an increase in the die size. The 2.5 packaging architecture allows implementation without the technical complexity seen with a 3D packaging architecture. Thus, the use of the memory die as described herein provides a good balance between computing speed and technical considerations associated with the packaging architecture.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device, comprising:
a first die including a first bond pad, a first side and a second side opposite the first die, wherein the first bond pad is disposed along the first side of the first die;
a second die including a second bond pad, a first side and a second side opposite the second die, wherein the second bond pad is disposed along the first side of the second die; and
a first interconnect,
wherein:
the first die and the second die are in a chip first, die face-up configuration with the first sides of the first die and the second die facing up,
the first die or the second die is configured to function as a power management controller, and
the first bond pad and the second bond pad are electrically connected along a first solderless connection between the first die and the second die, the first solderless connection operated at current densities ranging from about 0.15 mA/microns$^2$ to about 10 mA/microns$^2$.

2. The electronic device of claim 1, wherein the first solderless connection includes one or more materials, each of which has a flow point or a melting point temperature greater than 300° C.

3. The electronic device of claim 1, wherein the first solderless connection withstands the current densities ranging between about 0.15 mA/microns$^2$ to about 10 mA/microns$^2$ before the first solderless connection fails using an electromigration test where the solderless connection is held at 110° C. for 50,000 hours.

4. The electronic device of claim 1, wherein the power management controller is a DC-to-DC step-down switching regulator.

5. The electronic device of claim 1, wherein the first die or the second die has the principal function as the memory.

6. The electronic device of claim 1, wherein the first die includes a processor, and the second die is the power management controller.

7. The electronic device of claim 1, wherein the first interconnect is first component of a redistribution structure.

8. The electronic device of claim 7, further comprising a second interconnect, wherein:
the first die further includes a third bond pad,
the second die further includes a fourth bond pad,
the third bond pad and the fourth bond pad are electrically connected along a second solderless connection that includes the second interconnect,
the second interconnect is a second component of the redistribution structure, and
within the redistribution structure, the second interconnect is at a different elevation as compared to the first interconnect.

9. The electronic device of claim 1, further comprising a polymer material disposed within a gap between the first die and the second die, wherein the first interconnect overlies the polymer material and spans the gap.

10. The electronic device of claim 1, further comprising a first conductive stud and a second conductive stud that are components within of the first solderless connection, wherein:
the first conductive stud contacts the first bond pad, and
the second conductive stud contacts the second bond pad.

11. The electronic device of claim 1, further comprising a conductive pillar coupled to the first die or the second die, wherein the conductive pillar is configured to be an external terminal for the electronic device.

12. The electronic device of claim 11, wherein no conductive pillar of the electronic device contacts the first solderless connection.

13. The electronic device of claim 1, wherein the first solderless connection defines a conductive path free of bumps such that a gap between the first die and the second die is reduced to bring the first die closer to the second die and the first interconnect spans across a larger surface area of the first die and the second die.

14. An electronic device, comprising:
a first die including a first bond pad, a first side and a second side opposite the first die, wherein the first bond pad is disposed along the first side of the first die;
a second die including a second bond pad, a first side and a second side opposite the second die, wherein the second bond pad is disposed along the first side of the second die; and
a first interconnect,
wherein:
the first die is oriented such that the first side of the first die is above the second side of the first die,
the second die is oriented such that the first side of the second die is above the second side of the second die,
the first die or the second die is configured to function as a power management controller, and
the first bond pad and the second bond pad are electrically connected along a first connection being a solderless connection between the first die and the second die, wherein the solderless connection withstands current densities ranging from about 0.15 mA/microns$^2$ to about 10 mA/microns$^2$, wherein each material within the first connection between the first bond pad and the second bond pad has a flow point or melting point of at least 300° C.

15. The electronic device of claim 14, further comprising a first conductive stud and a second conductive stud, wherein:
the first conductive stud contacts the first bond pad of the first die,
the second conductive stud contacts the second bond pad of the second die, and
the first conductive stud, the second conductive stud, and the first interconnect lie along an electrical conduction path between the first bond pad and the second bond pad.

16. The electronic device of claim 14, further comprising a conductive pillar, wherein the conductive pillar is coupled to a third bond pad of the first die or the second die, and the conductive pillar is configured to be an external terminal for the electronic device.

* * * * *